United States Patent
Harada et al.

(10) Patent No.: US 6,742,981 B2
(45) Date of Patent: Jun. 1, 2004

(54) IC HANDLER

(75) Inventors: Keitaro Harada, Yamagata (JP); Masayoshi Yokoo, Higashine (JP); Shigeo Onuma, Yamagata (JP); Satoshi Ueno, Yamagata (JP)

(73) Assignee: Tohoku Seiki Industries, Ltd., Yamagata (JP)

( * ) Notice: Subject to any disclaimer, the term of this patent is extended or adjusted under 35 U.S.C. 154(b) by 0 days.

(21) Appl. No.: 10/204,256

(22) PCT Filed: Dec. 19, 2001

(86) PCT No.: PCT/JP01/11155
§ 371 (c)(1),
(2), (4) Date: Aug. 19, 2002

(87) PCT Pub. No.: WO02/50559
PCT Pub. Date: Jun. 27, 2002

(65) Prior Publication Data
US 2003/0012633 A1 Jan. 16, 2003

(30) Foreign Application Priority Data
Dec. 20, 2000 (JP) ........................................ 2000-404491

(51) Int. Cl.[7] .................................................. B65H 1/00
(52) U.S. Cl. .................. 414/783; 414/223.01; 414/225; 198/345.1; 198/471.1
(58) Field of Search ................... 414/223.01, 223.02, 414/224, 225, 783, 784, 935, 941; 198/345.1, 346.2, 471.1

(56) References Cited

U.S. PATENT DOCUMENTS

| | | | |
|---|---|---|---|
| 5,469,953 A | * | 11/1995 | Igarashi et al. ............ 198/345.2 |
| 5,596,270 A | | 1/1997 | Mitsui |
| 5,708,222 A | | 1/1998 | Yonezawa et al. |
| 5,957,305 A | * | 9/1999 | Takahashi .................... 209/573 |
| 6,384,360 B1 | * | 5/2002 | Masuo et al. ................ 209/573 |
| 6,456,062 B2 | * | 9/2002 | Yamashita et al. ........ 324/158.1 |

FOREIGN PATENT DOCUMENTS

| | | |
|---|---|---|
| DE | 198 23 933 A1 | 2/1999 |
| JP | 6-177583 | 6/1994 |

OTHER PUBLICATIONS

Austria Search Report, dated Apr. 23, 2003, for Singapore Application No. 200204933–6, which corresponds to the above–identified application.
International Search Report of PCT/JP01/11155, dated Apr. 16, 2002.

* cited by examiner

Primary Examiner—Gene O. Crawford
(74) Attorney, Agent, or Firm—Christie, Parker & Hale, LLP

(57) ABSTRACT

A disk (6) is horizontally rotated a half-turn by a motor (7) in a rotational direction and, then, is rotated a half-turn in an opposite rotational direction. Two servomotors (8, 9) are symmetrically disposed, on an upper surface of the disk (6), with respect to a rotating shaft of the disk (6). Driving shafts (22, 23), driven by the two servomotors (8, 9), downwardly extend through the disk (6), and move hanging members (K, M), respectively, in upward-and-downward directions. Two hanging members (K, M) are provided, at their lower ends, with clampers (32), respectively. The clampers (32) are each provided, at their bottom surfaces, with a suction pad (35), and are provided, at their upper surfaces, with pneumatic cylinders (28, 29). The pressure of the compressed air supplied to the pneumatic cylinder is adjusted by a pressure regulating device (38).

3 Claims, 6 Drawing Sheets

IC HANDLER

CROSS-REFERENCE TO RELATED APPLICATION

This application claims priority of Japanese Patent Application No. 2000-404491, filed on Dec. 20, 2000.

TECHNICAL FIELD

The present invention relates to an IC handler able to transfer an IC device. Particularly, it relates to an IC handler able to rotationally transfer an IC device.

BACKGROUND ART

As an IC handler which transfers an IC device to an IC socket and removes an inspected IC device from an inspecting device, a pick-and-place type, a rotary index type, and a cam index type are well known.

An electric cable or an air tube is often attached to the IC handler to supply energy, such as electricity or compressed air, necessary to carry out a rotating operation or a clamping operation. An index table using a number of cams are used to prevent the electric cable or the air tube from being twisted during operation. In the index table, cam surfaces are locally worn in proportion to the period of use, and the worn portion results in chattering, and reduces the positioning accuracy, thus leading to overrun or the like, or breakage of the IC device to be inspected or the IC socket.

In an IC handler which rotates only in one direction, the attachment of the electric cable or the air tube is complicated and expensive. Accordingly, a number of cams are used to clamp the IC device when inspection. However, it is difficult, in such a IC handlers, to make a fine adjustment and to easily adjust the pressure to be applied to an optimum value.

Thus, the IC handler in which the pressure applied to the clamper cannot be adjusted, or in which there is no function to prevent overload, has a problem that an inspection measuring board can be damaged when two overlapped IC devices are abnormally supplied. Moreover, there is a possibility that when a plurality of IC devices which are aligned and supplied at one time are inspected by means of an U-shaped spring probe, the latter cannot sufficiently absorb irregularity in height of the IC socket or in thickness of the IC device. Also, recent spring probes whose compression stroke is short sometimes cannot be used.

In view of the above problems, the object of the present invention is to provide a simple IC handler in which wear tends not to occur, so that the accuracy can be maintained for a long time.

Another object of the present invention is to make the applied pressure adjustable.

DISCLOSURE OF THE INVENTION

According to the present invention, there is provided an IC handler, comprising
  a disk which is rotatably supported in a horizontal plane;
  two controllable motors disposed on an upper surface of the disk;
  two driving shafts that downwardly extend through the disk, and that are driven by the two motors respectively, said driving shafts being disposed symmetrically with respect to an axis of rotation of the disk;
  two hanging members that are engaged with the two driving shafts respectively via driving force converting mechanisms, and that are upwardly and downwardly moved by the rotation of the driving shafts;
  a clamper attached to a lower end of each of the hanging members;
  a suction pads attached to lower ends of the clampers; and
  a disk driving motor that can rotate the disk in a first rotational direction and a second rotational direction opposite to the first rotational direction, wherein
    after the disk is stopped at a first angular position for a predetermined period, the disk is rotated in the first rotational direction, to a second angular position which is deviated from the first angular position by 180 degrees, by means of the disk driving motor and, after the disk is stopped at the second angular position for a predetermined period, the disk is rotated, in the second rotational direction, to the first angular position;
    during the stop at the first angular position, the clamper engaged with one of the driving shafts carries out a first operation, and the clamper engaged with the other driving shaft carries out a second operation; and
    during the stop at the second angular position, the clamper engaged with said one driving shaft carries out the second operation, and the clamper engaged with the other driving shaft carries out the first operation.

According to an embodiment of the present invention, a pneumatic cylinder is provided above the clampers; and pressurized air is supplied from an air pressure supplying means to the pneumatic cylinder via a pressure regulator which can finely adjust the pressure.

According to another embodiment of the present invention, the disk driving motor is located on the outside of the disk and rotates the disk via a belt.

Embodiments of the present invention will be described below with reference to accompanying drawings.

BEST MODE FOR CARRYING OUT THE INVENTION

Figure 1:
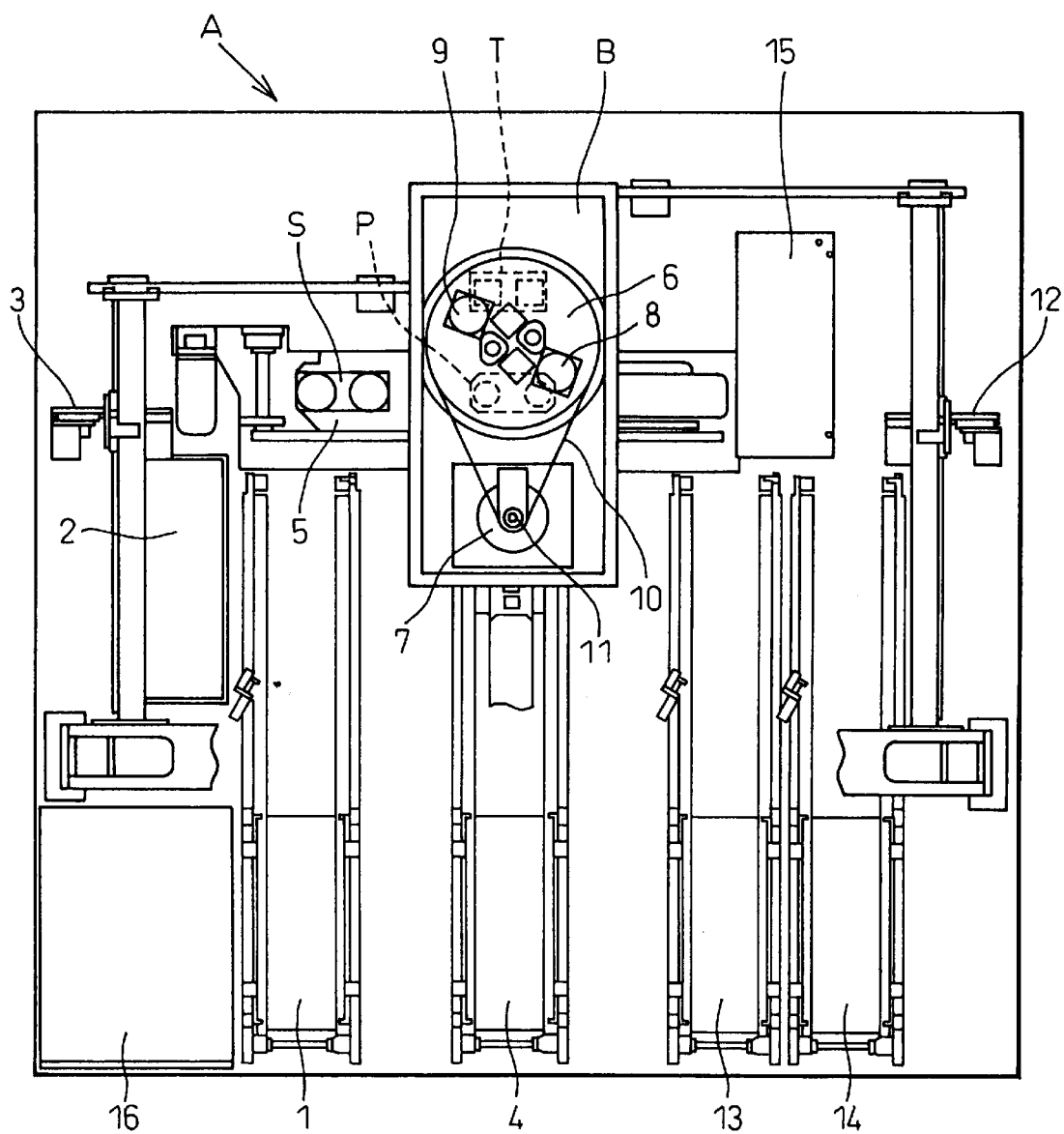
FIG. 1 is a plan view of the entirety of an IC handler composed of devices according to the present invention.

In FIG. 1, on an upper surface of a machine frame table A, numeral 1 designates a loader for a filling tray, 2 designates a preheat panel, 3 designates a supplying hand, 4 designates a buffer of an empty tray, 5 designates a transverse transfer plate, 6 designates a disk, 7 designates a control motor for driving a disk, 8 and 9 designate control motors mounted on the disk 6, 10 designates a disk driving belt, 11 designates a pulley of the motor 7, T designates an IC socket, 12 designates a discharging hand, 13, 14 designate unloaders for inspected products, 15 designates a single-placed unloader, and 16 designates an operating box. An electric cable connected to the IC socket T is coupled to a measuring device (not shown) below the table A.

The leading end of the loader 1 for the filling tray is of a magazine structure in which the trays are stacked and transferred in sequence. More than several tens of IC devices, or more than one hundred IC devices in some instances, are regularly arrayed on each of the trays whose outer dimensions are identical. The stacked trays are upwardly transferred one by one from the lowermost one, in FIG. 1. The tray is stopped and locked when it reaches a predetermined position of the loader 1. Then, the supplying hand 3 begins moving, and draws and holds the predetermined number of IC devices, due to suction from the tray, to supply the same to the IC transit portion S at a left end portion of the transverse transfer plate 5. After that, the transverse transfer plate 5 moves in a rightward direction, and stops at a predetermined position.

B designates an inspection transfer device, and the structure thereof will be described later, in detail, with reference to FIG. 2 etc. The disk 6 is rotated 180 degrees, in forward-and-reverse directions, by the control motor 7 for driving the disk. The suction pad 35, provided on a lower end of a cylinder case 28 at the side of a first stage, draws and holds the IC device from the IC transit portion S of the transverse transfer plate 5, at a position symmetric with respect to the rotational axis of the disk 6, below the disk 6 and, then, moves upwardly. Then, the disk 6 is rotated 180 degrees to place the IC device above the IC socket T at a second stage.

At this time, the transverse transfer plate 5 moves in a leftward direction, so that the supplying hand 3 can supply a subsequent IC device to the IC transit portion S. At this moment, the suction pad 35 provided on the other cylinder case 29 draws and holds the inspected IC device, and is positioned above the IC discharging and receiving portion P provided on a right end portion of the transverse transfer plate 5 that has moved in a leftward direction. The suction pad 35 is moved downwardly to mount the inspected IC device on the IC discharging and receiving portion.

When the transverse transfer plate 5, on which the IC device supplied by the supplying hand 3 and the inspected IC device are placed, moves in a rightward direction, a discharging hand 12 is driven to pick up the inspected IC device from the IC discharging and receiving portion P. The IC device is already pressed into the IC socket, and is measured by a measuring device. The information based on the measured value is transmitted to the discharging hand 12 to indicate a target point to which the inspected IC device is to be discharged.

Namely, a characteristic of the IC device is detected by the measuring device and, then, a rank in quality of the IC device becomes clear. Thus, the IC device is rated on several levels based on a result of the measurement. Accordingly, a usable IC device is distinguished from an unusable or defective one in accordance with the object for which the IC device is used.

Based on the information about quality, the discharging hand 12 moves, in accordance with the quality of each IC device, to discharge the IC device to a target area, for example, trays of the unloader 13 and the unloader 14 or a tray of the single-place unloader 15. A routine operation of the present invention is completed by carrying out the series of operations mentioned above. The sequence of operations for each function is successively carried out in accordance with a program input to a computer (not shown) incorporated in the operation box 16. An operating switch, a mouse and a monitor, which are not shown here, are attached to the operation box 16.

The operation of each component shown in FIG. 1 has been described above. The inspection transfer device B, the essential portion of the present invention, will be described in more detail with reference to FIG. 2 and the drawings subsequent thereto. Pulleys 18, 19 are secured to output shafts of servomotors 8, 9 provided on the disk 6, respectively. The belt 20 winding around a pulley 18 winds about a pulley 24 secured to a top of a ball screw 22 at the first stage. Similarly, a belt 21 runs between a pulley 19 and a pulley 25 on a top of a ball screw 23 in the second stage.

The ball screw 22 is screw-engaged with the hanging member K via a nut 26. Likewise, the ball screw 23 is screw-engaged with the hanging member M via a nut 27.

Figure 5:
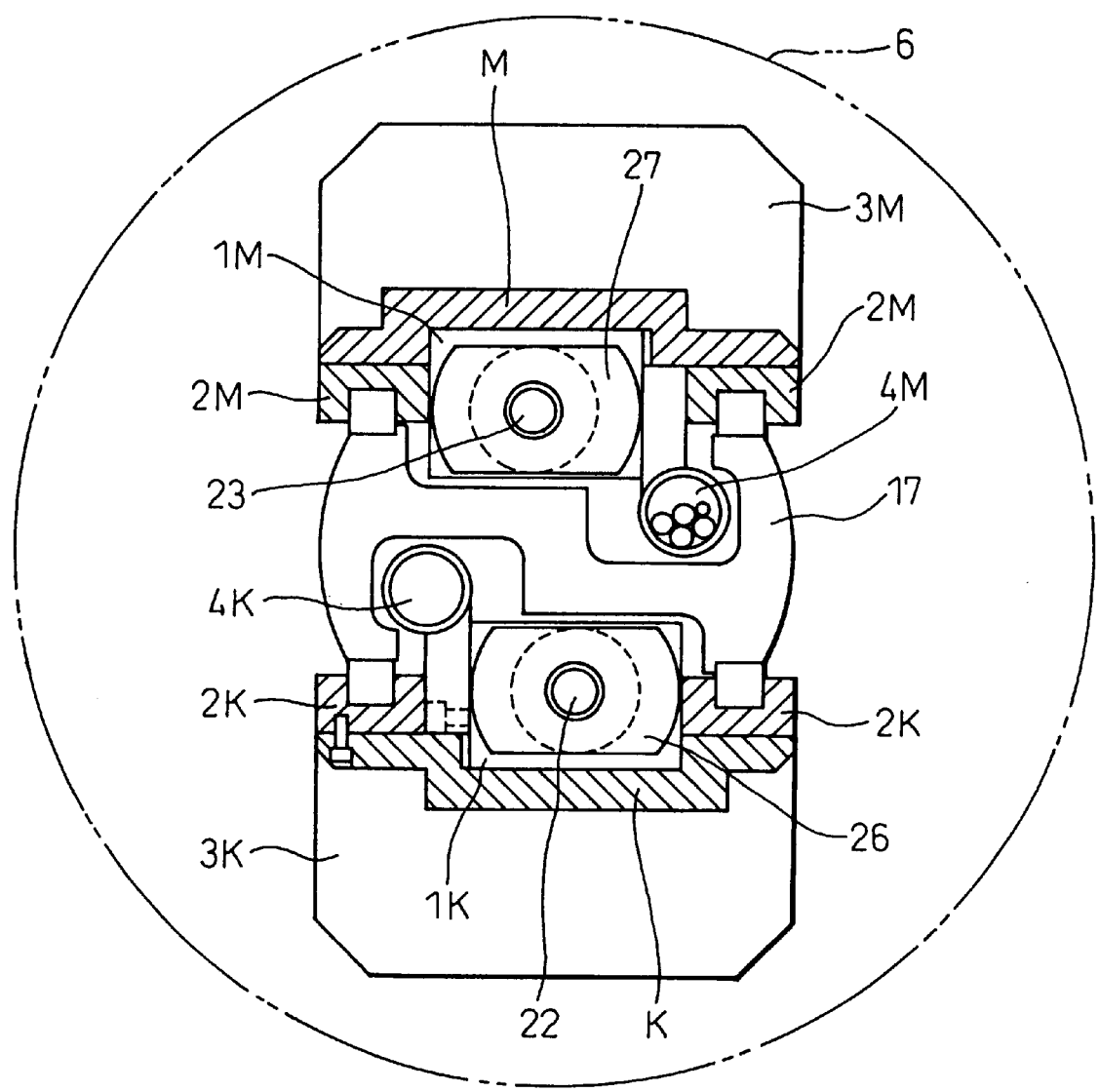
FIG. 5 is a sectional plan view of a hanging member.

As shown in a sectional plan view of FIG. 5, the hanging members K, M are identical in shape and are symmetrically arranged on opposite sides of a shaft 17 of the disk with respect to the axis thereof. The nuts 26, 27 are secured to blocks 1K, 1M on the top portions of the hanging members K, M, respectively. Pairs of linear movement bearings 2K, 2M are secured to both sides of barrels of the nuts 26, 27, respectively. Rollers of the linear movement bearings 2K, 2M are in contact with the shaft 17 of the disk, so that no rotation of the hanging members K, M takes place.

L-shaped flanges 3K, 3M at the lower portions of the hanging members K, M are adapted to mount the same to pneumatic cylinders. Covering tubes 4K, 4M to protect tubes for supplying compressed air to the pneumatic cylinders and tubes for sucking air from the suction pads located at the lowermost portions of the cylinders are provided in parallel with the hanging members K, M, respectively.

Figure 3:
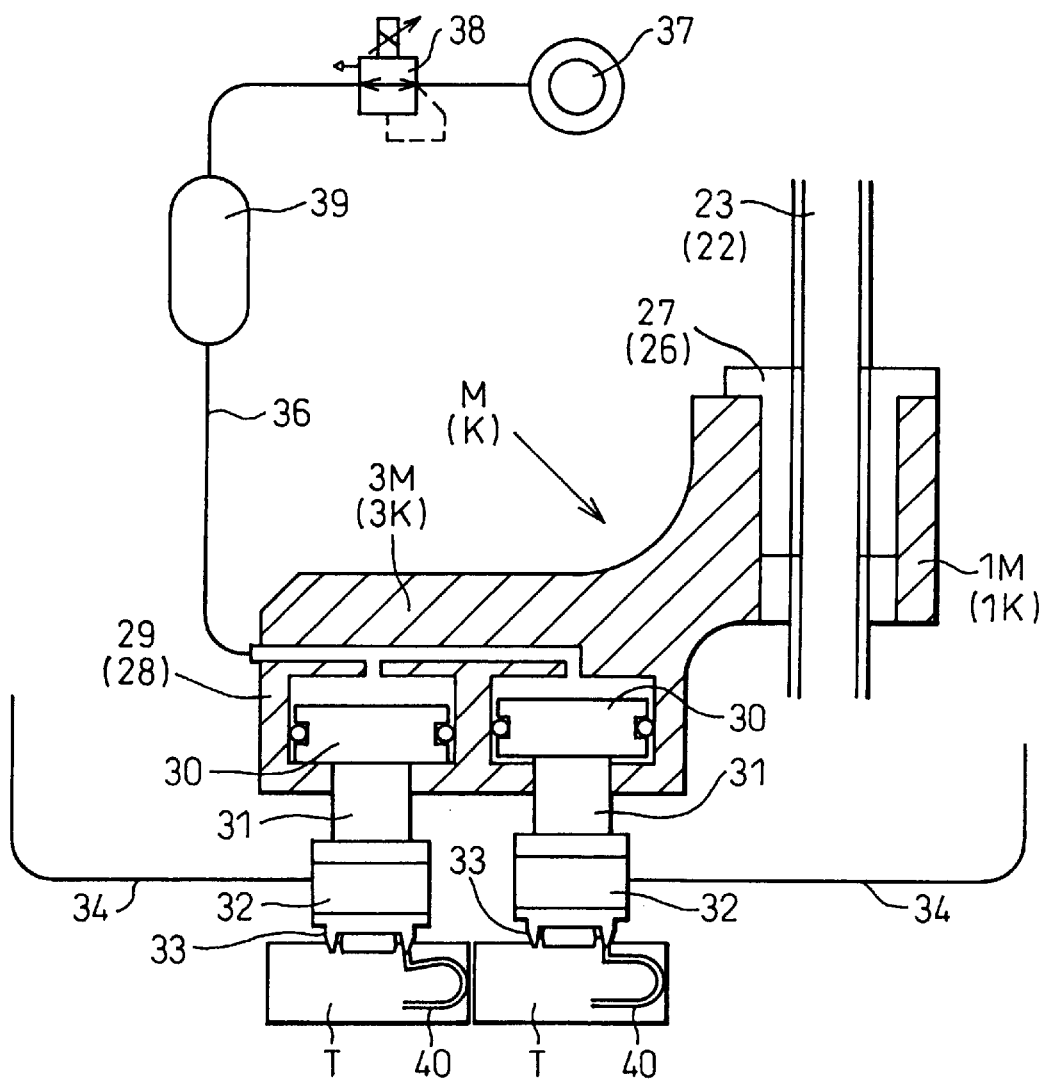
FIG. 3 is a partially enlarged longitudinal section of a main portion at a second stage, which explains the operations driving inspection.

Lower portions of the hanging members K, M are identical in structure. Therefore, only the hanging member M, in the second stage, provided with the IC socket T, will be described, in order to avoid an overlap. FIG. 3 is simplified for explanation. Actually, below the cylinder, the clampers 32, which are arrayed corresponding to the number of IC devices per one inspection and the arrangement of the IC devices, are detachably provided on the lower surface of the L-shaped flange 3M in the lower portion of the hanging member M.

Figure 2:
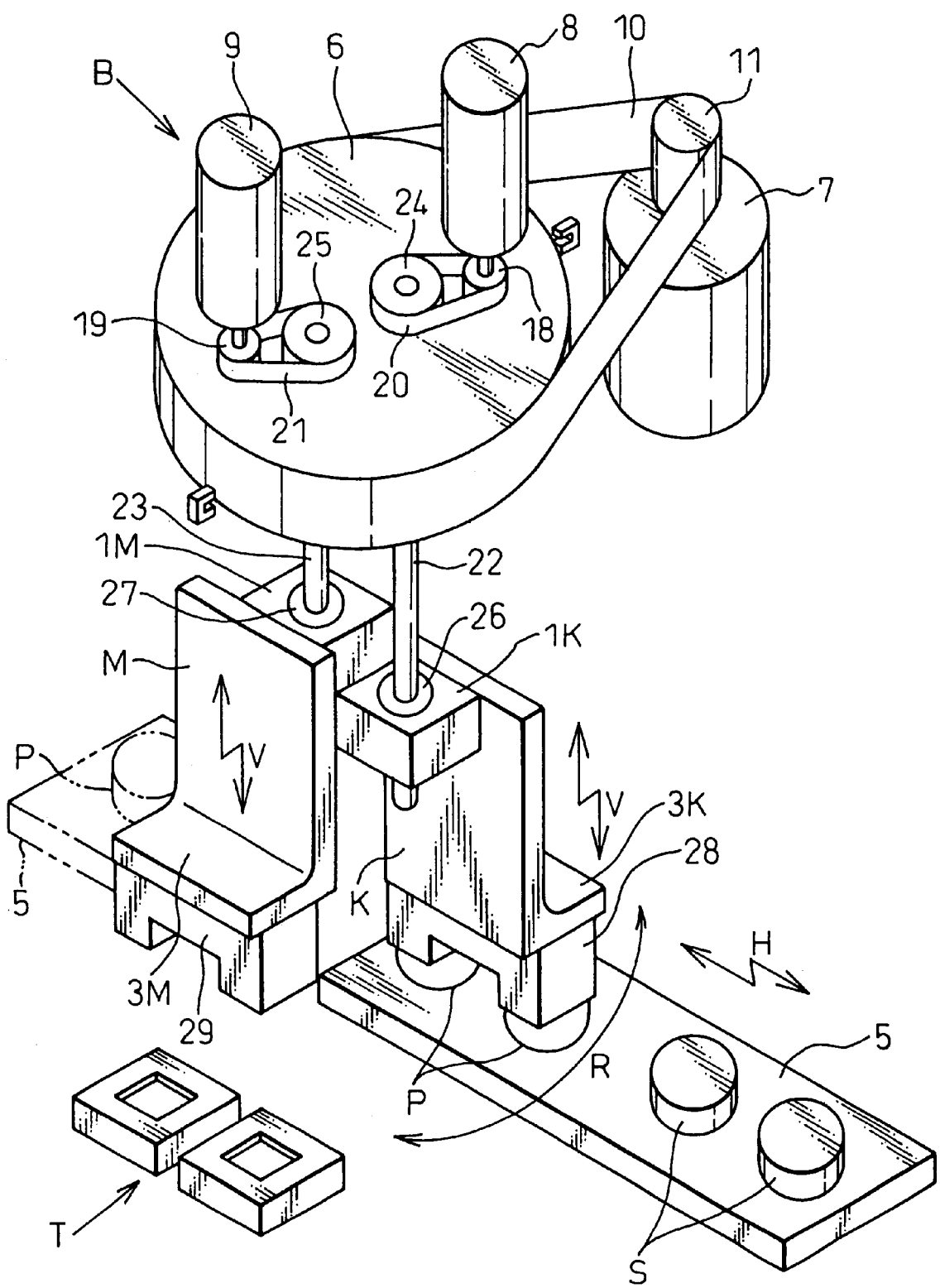
FIG. 2 is a perspective view of a main portion of the present invention.

FIG. 1 and FIG. 2 show an arrangement in which two IC devices are juxtaposed transversely. FIG. 3 shows an arrangement in which two IC devices are longitudinally arrayed, or it may be deemed that FIG. 3 shows a two-row and two-line arrangement of four IC devices. Pistons 30 are inserted in a cylinder case 29. Piston rods 31 project downwardly from the respective pistons 30. The clampers 32, 32 are attached to the top end portions of the piston rods 31, 31.

Figure 4:
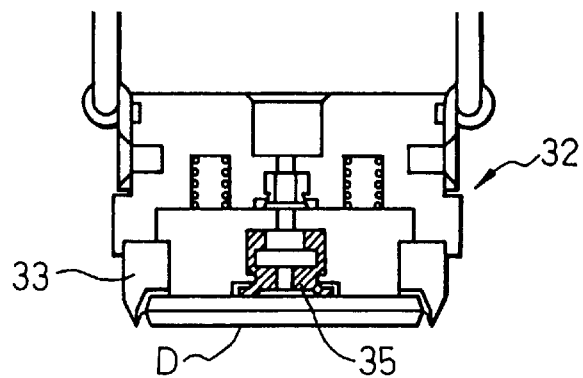
FIG. 4 is a longitudinal section of a clamper.

A guiding lug 33 is formed on the peripheral portion of the lower surface of the clamper 32. As shown in FIG. 4, the suction pad 35 is provided on the center of the lower surface of the clamper 32, and a vacuum tube 34 is connected to the suction pad 35. In FIG. 3, reference numeral 36 designates an air tube for supplying compressed air. The air tube 36 supplies air from a connector 37 to the cylinder 29 via a pressure adjusting valve 38 and an auxiliary tank 39. Compressed air set at a predetermined pressure is supplied to the cylinder 29.

In the IC handler provided with the inspection transfer device B as described above, operations of the inspection transfer device B will be concretely described.

Figure 6:
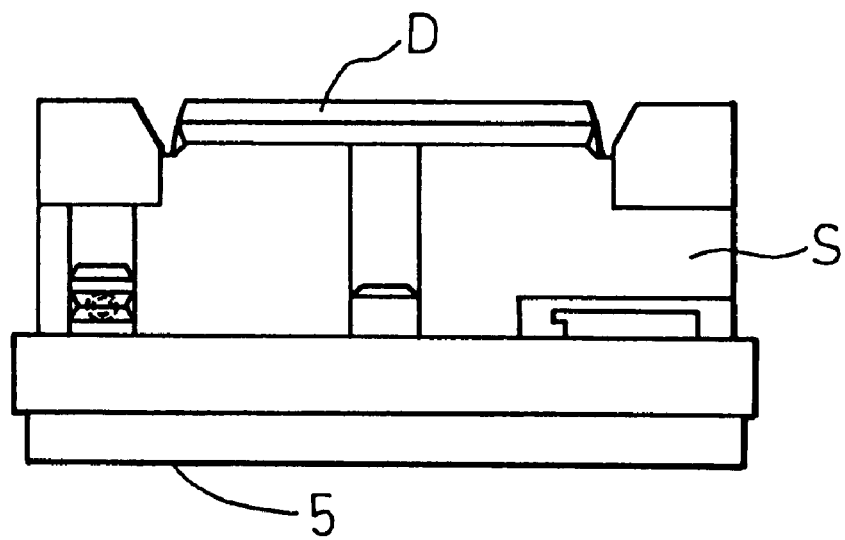
FIG. 6 is a longitudinal section of an IC transit portion of a transverse transfer plate.

The supplying hand 3 transfers a predetermined number of IC devices D from a tray transferred upwardly by the loader 1 in FIG. 1 onto the IC transit portion S of the transverse transfer plate 5, and supplies the same to the IC transit portion S as shown in FIG. 6.

Figure 7:
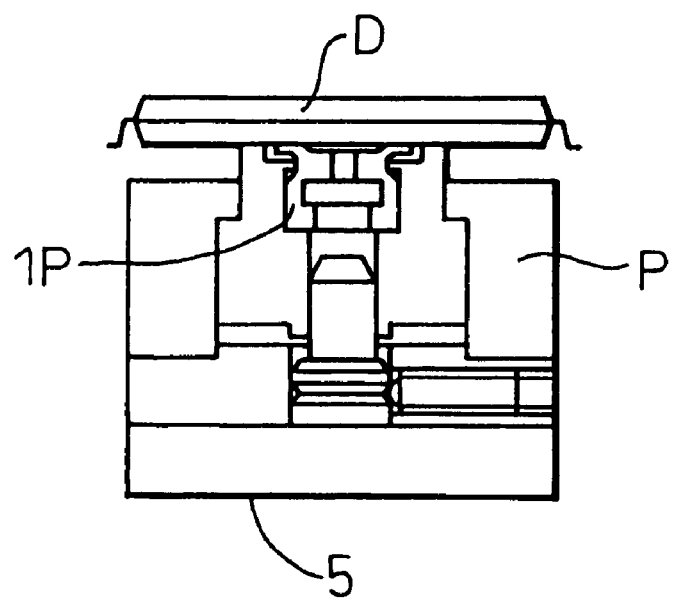
FIG. 7 is a longitudinal section of an IC discharging and receiving portion of a transverse transfer plate.

On the other hand, the IC discharging and receiving portion P is disposed on the transverse transfer plate 5 in the first stage of the inspection transfer device B. Therefore, when the inspected IC device D is placed on the IC discharging and receiving portion P as shown in FIG. 7, the IC device D is drawn and held on the transverse transfer plate 5 by a suction pad 1P provided in the IC discharging and receiving portion P. Alternatively, there is the IC discharging and receiving portion P having the same shape as that in FIG. 6.

The transverse transfer plate 5 holding two kinds of IC devices D, i.e., the IC device D before inspection and the inspected IC device D, is moved in a direction of an arrow H in FIG. 2 and, then is positioned as shown by a phantom line.

When the discharging hand 12 holds the IC device D held by the IC discharging and receiving portion P due to suction at a position indicated by the phantom line, the holding of the IC discharging and receiving portion P is released and, then, the IC device D is fed to a predetermined area in accordance with the above-described selection system.

For a new IC device D that is held, as shown in FIG. 6, on the IC transit portion S and has been transversely transferred to the first stage, the servomotor 8 provided on the disk 6 of the inspection transfer device B rotates the ball screw 22. As the nut 26 screw-engaged with the ball screw 22 is prevented from rotating, the hanging member K to which the nut 26 is attached is moved in the upward-and-downward directions shown by an arrow V.

The upward movement or the downward movement is determined based on the rotational direction of the servomotor. Therefore, the servomotor to be used has characteristics that the rotational direction can be quickly switched, the rotation can be stopped correctly when the number of revolutions reaches a predetermined value, or the rotational speed can be responsively and quickly adjusted.

When a suction surface of the suction pad 35 provided on the lower surface of the clamper 32 provided via the cylinder 28 provided on the lower surface of the L-shaped flange 3K of the hanging member K is downwardly moved until it reaches the IC device D, the rotation of the servomotor 8 is stopped to stop the downward movement of the hanging member K. At this time, air is discharged from the suction pad 35 by means of the vacuum tube 34 disposed in the clamper 32 and, then the suction pad 35 draws and holds the IC device D.

Next, the servomotor 8 is rotated in a reverse direction to move the hanging member K upwardly, and waits until the measurement at the second stage is completed.

When the measurement at the second stage is completed, the suction pad 35 provided on the lower surface of the clamper 32 provided via the cylinder 29 provided on the lower surface of the L-shaped flange 3M of the hanging member M, draws and holds the measured IC device D to move the same upwardly. When the IC device D is moved slightly upward, the servomotor 7 for driving the disk is energized to rotate the disk 6. The IC device D continues to be moved upward, during the rotation of the disk 6, until it reaches a predetermined height and, then the rotation of the servomotor 9 is stopped. Thus, the disk 6 rotates 180 degrees while the IC device D is maintained at the predetermined height.

The angle of rotation of the disk 6 to obtain a height to lift the IC device D, is not constant because the placement area of the IC devices D varies depending on the number of IC devices to be moved upward at one time and the arrangement of the IC devices. The relationship between the angle of rotation and the area is shown in FIG. 8.

Figure 8:
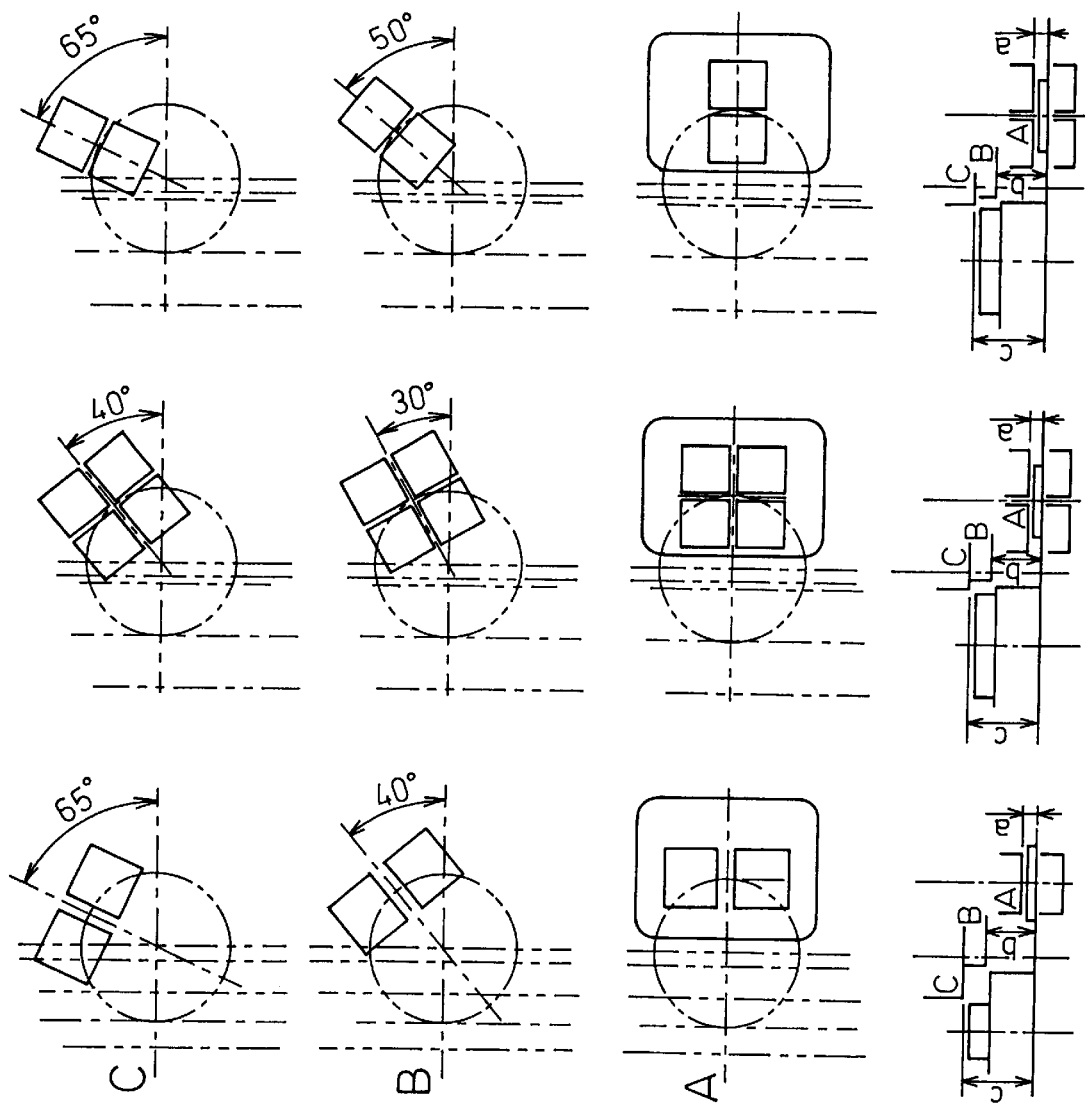
FIG. 8 shows diagrams of a relationship between a required upward displacement of a hanging member and an allowable rotation angle thereof.

The relationship as shown in FIG. 8 is required in order to prevent interference of the IC device D with parts of the apparatus when the disk 6 rotates to remove the IC device D upward from the IC socket T in the second stage, and in order to reduce the displacement of each part to thereby reduce as much as possible the operation time.

The same is true for the downward movement to the second stage while rotating.

FIG. 8 will be described. FIG. 8 shows arrangements of three kinds of sockets to which the IC devices D are set in the second stage, and the movements of the clampers.

In FIG. 8, a line A represents the position of the IC sockets T at which, when the clampers 32 are moved upward to the height "a", the disk 6 can begin to rotate. Line B and line C indicate that the clampers must be moved upward to heights "b", and "c", in order to rotate the disk 6 by an angle more than a certain angle, in accordance with the arrangement of the IC devices D.

Next, FIG. 8 will be described using numeric values. As shown at left side in FIG. 8, in case of two IC devices placed in series, it is required that the clamper is moved upwardly to the height "b" so that the disk 6 can rotate more than 40° without interference with the transverse transfer plate 5, and it is required that the clamper is moved upwardly higher than the height "c" so that the disk 6 can rotate more than 65° without interference with the IC discharging and receiving portion P and the IC transit portion S. If a pitch or a size is different in the same arrangement, numeric values vary.

As described above, when the disk 6 rotates 180 degrees to place the clamper 32 above the IC socket T, as shown in FIG. 2, the servomotor 8 is energized, during 180 degrees rotation of the disk 6, to rotate the ball screw 22. As the nut 26 screw-engaged with the ball screw 22 is prevented from rotating and is secured to the hinging member K, the hanging member K begins to move downwardly due to the rotation of the ball screw 22.

After controlling the angle of rotation of the disk 6 and the downward displacement of the hanging member K to complete the 180 degrees rotation of the disk 6, when the IC device D held by the suction pad 35 of the clamper 32 provided on the lower end portion of the hanging member K is inserted into the IC socket T by moving the hanging member K downwardly, the rotation of the servomotor 8 is stopped and the downward movement of the hanging member K is stopped.

The cylinder 28 is attached to the L-shaped flange 3K of the hanging member K. The clamper 32 is attached to the top end portion of the piston rod 31 of the cylinder 28. When the downward movement of the hanging member K is stopped at a predetermined height, the clamper 32 presses the IC device D into the IC socket T, by an appropriate force from the piston 30 via the piston rod 31, because compressed air controlled at a predetermined pressure by the pressure adjusting valve 38 is supplied to the cylinder 28 through the air tube 36.

Namely, as shown in FIG. 3, as the pressure adjusting valve 38 and the auxiliary tank 39 are provided on the air tube 36, the pressurized air to be supplied can be easily changed by remote-operating the pressure adjusting valve 38 by means of the operating box 16, and the clamper 32 can be pressed by a desired constant force, regardless of the stroke, to press the clamper 32.

Therefore, the present invention can be applied to a probe spring 40 having a small stroke, provided in the IC socket T. Since sudden rise in pressure which transiently occurs when the clamper 32 is pressed against the IC device D is diffused and absorbed by the auxiliary tank 39, fluctuations of air pressure can be restricted.

As is clear from the above detailed description, in the IC handler of the present invention, the disk is rotated by a half turn in the forward and reverse directions by the servomotor, and hence the structure thereof is simple, and since there is no portion in which parts are strongly in sliding contact with each other, wearing hardly occurs. Thus, the IC handler can operate with stability for a long time. It is not necessary to provide means for preventing the electric cables or air tubes connected to a motor or a pneumatic cylinder attached to the disk from being twisted. In addition, the servomotor to rotate the disk can be easily energized or stopped with high accuracy. Therefore, the inspection speed of the IC devices can be increased.

If the clampers attached to the lower end portions of the hanging members can be replaced with one or plural clampers, the IC handler is adaptable to various kinds of IC devices. If a pneumatic cylinder is provided above the clampers, and pressurized air is supplied from an air pressure supplying means to the pneumatic cylinder via a pressure regulating device that can finely adjust the pressure, the adjusting speed of the pressing force can be improved, and an optimum force can be applied to the clampers. Thus, the IC handler of the present invention can be applied to a probe spring, in the IC socket, which has a small stroke and which has been recently increased in number.

What is claimed is:

1. An IC handler, comprising
   a disk which is rotatably supported in a horizontal plane;
   two controllable motors disposed on an upper surface of the disk;
   two driving shafts that downwardly extend through the disk, and that are driven by the two motors respectively, said driving shafts being disposed symmetrically with respect to an axis of rotation of the disk;
   two hanging members that are engaged with the two driving shafts respectively via driving force converting mechanisms, and that are upwardly and downwardly moved by the rotation of the driving shafts;
   a clamper attached to a lower end of each of the hanging members;
   suction pads attached to the lower ends of the clampers; and
   a disk driving motor that can rotate the disk in a first rotational direction and a second rotational direction opposite to the first rotational direction, wherein
   after the disk is stopped at a first angular position for a predetermined period, the disk is rotated in the first rotational direction, to a second angular position which is deviated from the first angular position by 180 degrees, by means of the disk driving motor and, after the disk is stopped at the second angular position for a predetermined period, the disk is rotated, in the second rotational direction, to the first angular position;
   during stop at the first angular position, the clamper engaged with one of the driving shafts carries out a first operation, and the clamper engaged with the other driving shaft carries out a second operation; and
   during stop at the second angular position, the clamper engaged with said one driving shaft carries out the second operation, and the clamper engaged with the other driving shaft carries out the first operation.

2. An IC handler according to claim 1, wherein
   a pneumatic cylinder is provided above the clampers; and pressurized air is supplied from an air pressure supplying means to the pneumatic cylinder via a pressure regulator which can finely adjust the pressure.

3. An IC handler according to claim 1, wherein
   the disk driving motor is located on the outside of the disk and rotates the disk via a belt.

* * * * *